United States Patent
McKevitt et al.

(10) Patent No.: US 7,069,795 B2
(45) Date of Patent: Jul. 4, 2006

(54) SENSOR USING ELECTRO ACTIVE CURVED HELIX AND DOUBLE HELIX

(75) Inventors: Gareth McKevitt, Cambridge (GB); Anthony Hooley, Cambridge (GB); David Henry Pearce, Birmingham (GB); Ursula Ruth Lenel, Cambridge (GB); Mark Richard Shepherd, Hertfordshire (GB)

(73) Assignee: 1...Limited, Cambridge (GB)

( * ) Notice: Subject to any disclaimer, the term of this patent is extended or adjusted under 35 U.S.C. 154(b) by 0 days.

(21) Appl. No.: 10/480,675

(22) PCT Filed: Jun. 19, 2002

(86) PCT No.: PCT/GB02/02781

§ 371 (c)(1),
(2), (4) Date: Jul. 12, 2004

(87) PCT Pub. No.: WO02/103294

PCT Pub. Date: Dec. 27, 2002

(65) Prior Publication Data

US 2004/0237676 A1 Dec. 2, 2004

(30) Foreign Application Priority Data

Jun. 20, 2001 (GB) ................................ 0115074.7

(51) Int. Cl.
*G01L 1/04* (2006.01)
*H04R 17/00* (2006.01)

(52) U.S. Cl. ...................... 73/862.637; 73/753; 73/754; 73/862.636; 73/862.641; 73/862.68; 367/157; 367/159; 367/160; 367/161

(58) Field of Classification Search ................. 73/753, 73/754, 862.636, 862.637, 862.641, 862.68; 367/157, 159, 160, 161

See application file for complete search history.

(56) References Cited

U.S. PATENT DOCUMENTS 3,168,623 A    2/1965    Petermann
3,676,722 A *   7/1972    Schafft ........................ 310/332

(Continued)

FOREIGN PATENT DOCUMENTS

DE    19 45 448      3/1971
EP      0 251 901      1/1988

(Continued)

OTHER PUBLICATIONS

B.L.Jiao & J.D. Zhang; Torsional Modes in Piezo Helical Springs; IEEE Transactions on Ultrasonics, Ferroelectronics, and Frequency Control; vol. 46, No. 1, Jan. 1999.

(Continued)

*Primary Examiner*—Hezron Williams
*Assistant Examiner*—David A. Rogers
(74) *Attorney, Agent, or Firm*—Elman Technology Law, P.C.; Gerry J. Elman

(57) ABSTRACT

Various sensors use an electro-active device (11) electrically connected to a detector circuit. The electro-active device (11) comprises an electro-active structure in the form of a continuous electro-active member (12) curving in a helix around a minor axis (13) which is in itself curved for example in a helix around a major axis (14). On activation by relative displacement of the ends (16) of the device (11), the electro-active structure twists around the minor axis due to the fact that the minor axis (13) is curved. The continuous member (12) has a bender construction of a plurality of layers (21) and (22) including at least one layer of electro-active material so that concomitantly with the twisting the continuous member (12) bends generating an electrical signal detected by the detector circuit. The electro-active device (11) is advantageous as a sensing element in a sensor because it has a large displacement, high sensitivity and low compliance.

24 Claims, 5 Drawing Sheets

U.S. PATENT DOCUMENTS

Figure 1:
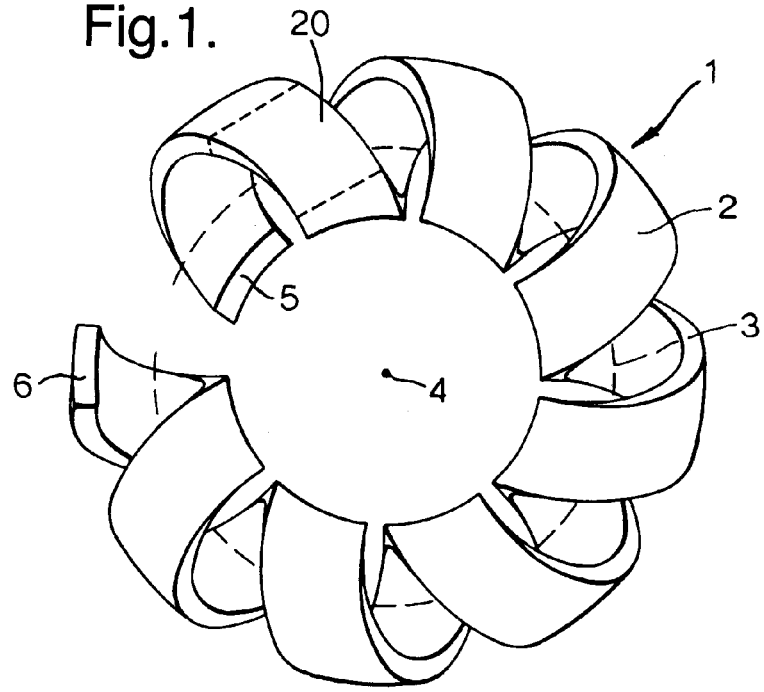

| | | | |
|---|---|---|---|
| 3,816,774 A | 6/1974 | Ohnuki et al. | |
| 3,900,748 A | 8/1975 | Adler | |
| 4,330,730 A | 5/1982 | Kurz et al. | |
| 4,335,608 A * | 6/1982 | Wood et al. | 73/753 |
| 4,435,667 A * | 3/1984 | Kolm et al. | 310/367 |
| 4,601,539 A | 7/1986 | Watanabe | |
| 4,638,207 A | 1/1987 | Radice | |
| 4,690,143 A * | 9/1987 | Schroeppel | 607/5 |
| 4,810,913 A * | 3/1989 | Beauducel et al. | 310/337 |
| 4,843,275 A * | 6/1989 | Radice | 310/334 |
| 4,984,222 A * | 1/1991 | Beauducel et al. | 367/159 |
| 5,440,194 A | 8/1995 | Beurrier | |
| 5,526,601 A * | 6/1996 | Onuma et al. | 43/17 |
| 5,552,657 A * | 9/1996 | Epstein et al. | 310/339 |

FOREIGN PATENT DOCUMENTS

| | | |
|---|---|---|
| GB | 2 322 232 | 8/1998 |
| GB | 2 329 514 | 3/1999 |
| JP | 11064096 | 3/1999 |
| WO | WO 98/09339 A1 | 3/1998 |
| WO | WO 98/34434 A1 | 8/1998 |
| WO | WO 99/54626 A1 | 10/1999 |
| WO | WO 01/47041 A2 | 6/2001 |

OTHER PUBLICATIONS

Dancila, D.S. et al; Large Displacement Piezoelectic Actuator Configurations; Adaptive Structures and Material Systems; Nov. 15-20, 1998; pp. 83-87; XP001004521, ASME, New York, New York, NY.

Rohrbach, Christof et al; "Handbuch für elektrisches Messen mechanischer Groessen"; 1967, VDI-Verlag, Duesselforf, XP002211994, p. 216.

* cited by examiner

SENSOR USING ELECTRO ACTIVE CURVED HELIX AND DOUBLE HELIX

The present invention relates sensors using an electro-active device, that is devices employing an electro-active structure arranged to sense relative displacement of the ends of the structure.

Electro-active materials are materials which deform in response to applied electrical conditions or, vice versa, have electrical properties which change in response to applied deformation. The best known and most developed type of electro-active material is piezoelectric material, but other types of electro-active material include electrostrictive material and piezoresistive material. Many devices which make use of electro-active properties are known.

Simple piezoelectric acceleration sensors comprise a block of piezoelectric material. However, as the piezoelectric effect is small, of the order $10^{-10}$ m/V, the sensitivity of the sensors is very low and the level of the output electrical signal is very low. This is one of the main drawbacks of this type of sensor, because the low signal level makes it susceptible to noise. Typically, special charge amplifiers and special cabling are required to minimise the noise and ensure that the generated signal detected by a detector circuit has a sufficiently low signal-to-noise ratio. This has caused many manufacturers to integrate the acceleration sensor and electronics into a single silicon device using modern micromachining technology and such devices are in widespread use for applications such as car air bags. As the displacement of the block of piezoelectric material is small, a mechanical actuator is needed, typically a basic cantilever, but this limits the sensitivity of the sensor as a whole.

More complicated electro-active structures have been developed to achieve larger displacements and have to an extent found application as displacement sensors. However such electro-active structures suffer from the following problems.

A known electro-active structure is the bender construction, for example a bimorph bender construction. With a bender construction, the electro-active structure comprises a plurality of layers at least one of which is of electro-active material. On mechanical activation by bending the bender perpendicular to the layers, the layers deform with a differential change in length between the layers for example one layer expanding and another layer contracting due to the layers being constrained by being coupled to one another. Accordingly a voltage is output on relative displacement of the ends of the structure. However, the relative displacement of the bender does not follow a linear path in space. As the structure bends and the degree of curvature increases, the relative displacement of the ends follows a curve in space. Furthermore, for a relatively large displacement, it is necessary to increase the length of the structure which therefore becomes inconvenient. For example, to achieve a displacement of the order of 0.1 mm with a bimorph bender construction, a structure of length around 5 cm is typically needed.

For use in a sensor it would be desirable for an electro-active device to be capable of undergoing a relatively large displacement which is linear in space with a relatively low compliance to improve sensitivity.

According to a first aspect of the present invention, there is provided a sensor comprising an electro-active device electrically connected to a detector circuit, the electro-active device comprising an electro-active structure which extends along a curved minor axis and arranged, on mechanical activation by relative displacement of the ends of the structure, for the structure concomitantly to twist around the minor axis to generate an electrical signal, the detector circuit being arranged to detect the generated electrical signal.

Concomitantly with the relative displacement between the ends of the device the twist of the structure around the minor axis occurs because of the fact that the device extends along a curved minor axis. The electro-active device uses the physical principal that twisting of a curved object causes displacement perpendicular to the local curve, and vice versa displacement of the ends of a curved object causes twisting along its length. The displacement is equivalent to a change in the orientation of the minor axis of the structure relative to its original orientation.

The device uses an electro-active structure which twists on activation. Considering any given small section of the structure along the curved minor axis it is easy to visualise how twist of that given section rotates adjacent sections and hence relatively displaces them in opposite directions perpendicular to the local curve of the given section, because the adjacent sections extend at an angle to the given section as a result of the curve of the minor axis. Therefore twisting of the given section is concomitant with a relative displacement of the adjacent sections perpendicular to the plane of the curve. The degree of twisting is proportional to the degree of curvature in the given section and the magnitude of the relative displacement. For minor axes which extend along a regular curve around a major axis, such as along an arc of a circle or a helix, relative displacement of the ends in the direction parallel to the major axis of the structure produces displacement in each section in the same direction. Therefore, the electro-active device in accordance to the present invention can sense displacement which is linear in space.

The range of displacement which may be sensed is proportional to the length of the structure along the minor axis, because each section of the structure along the minor axis contributes to the overall displacement. Therefore the sensor may be arranged to sense any desired degree of displacement by suitable design of the device, in particular by selection of the length of the structure along the minor axis and of the type of structure which controls the magnitude of the twisting-field response. As a result of the structure extending along a minor axis which is curved, a relatively compact device may be produced.

Also the device has a low compliance because an applied force or displacement is shared over all the sections of the device. This provides the device with a high sensitivity. A major advantage of the electro-active device as a sensor is its sensitivity. Because the device is mechanically compliant it produces a relatively large response signal and provides a good signal to noise ratio. Additionally, the precise value of this compliance can be engineered to match a given application by varying the device's geometric parameters.

In general, the curve along which the minor axis extends may be of any shape.

One possibility is for the curve along which the minor axis extends to be planar, for example as the arc of a circle or a spiral. In this case, the displacement on activation occurs perpendicular to the plane of the curve. The thickness of the device in the direction in which relative displacement occurs is merely the thickness of the electro-active structure so a relatively thin device may be produced.

Another possibility is for the curve along which the minor axis extends to be a helix. In this case, each helical turn of the structure contributes towards displacement in the direction along the geometrical major axis around which the helix is formed. Therefore a large degree of displacement may be achieved proportional to the number of helical turns, therefore producing relatively high displacement for a relatively compact device.

The electro-active structure is preferably arranged with portions arranged to be mechanically activated by being bent around the minor axis concomitantly with twisting of the structure around the minor axis. As a result, the electro-active portion may have any construction which bends on activation. Use of an electro-active structure which bends on activation is advantageous, because it allows selection of structure in which all the electro-active material of the structure is activated thereby increasing the efficiency of the device. Also, use of an electro-active structure which bends on activation provides for simplicity of design. The preferred construction is the known bender construction comprising a plurality of layers including at least one layer of electro-active material, preferably a bimorph bender construction having two layers. Such a construction is well known and understood as applied to a straight bender and particularly easy to manufacture. The same benefits are obtained when the bender construction is applied to the portions of the present invention. However, any other construction which provides bending on activation may be used.

Preferably, the electro-active structure comprises a continuous electro-active member curving around the minor axis, said electro-active portions being adjacent finite portions of the continuous member.

This structure is particularly easy to manufacture, for example by winding a deformable continuous electro-active member into shape.

Preferably wherein the continuous electro-active member curves in a helix around the minor axis.

By using a continuous electro-active member which curves in a helix around the minor axis a number of advantages are achieved. Firstly, it is easy to provide a structure which is regular along the length of the minor axis and hence provide the same degree of twisting along the entire length of the minor axis. Secondly, the helix is easy to manufacture, for example by winding a deformable continuous member into shape or by making a helical cut in a tubular electro-active member. Thirdly, the device is compact as the helical turns of the member around the minor axis may be packed closely together.

However the electro-active structure may alternatively comprise a continuous electro-active member having a different shape which provides for bending around the minor axis concomitantly with twisting around the minor axis. For example it may comprise a continuous member having the shape of a flat member twisted around the minor axis. Furthermore, instead of comprising a continuous electro-active member, the electro-active structure may comprise a plurality of electro-active portions coupled together.

Figure 2:
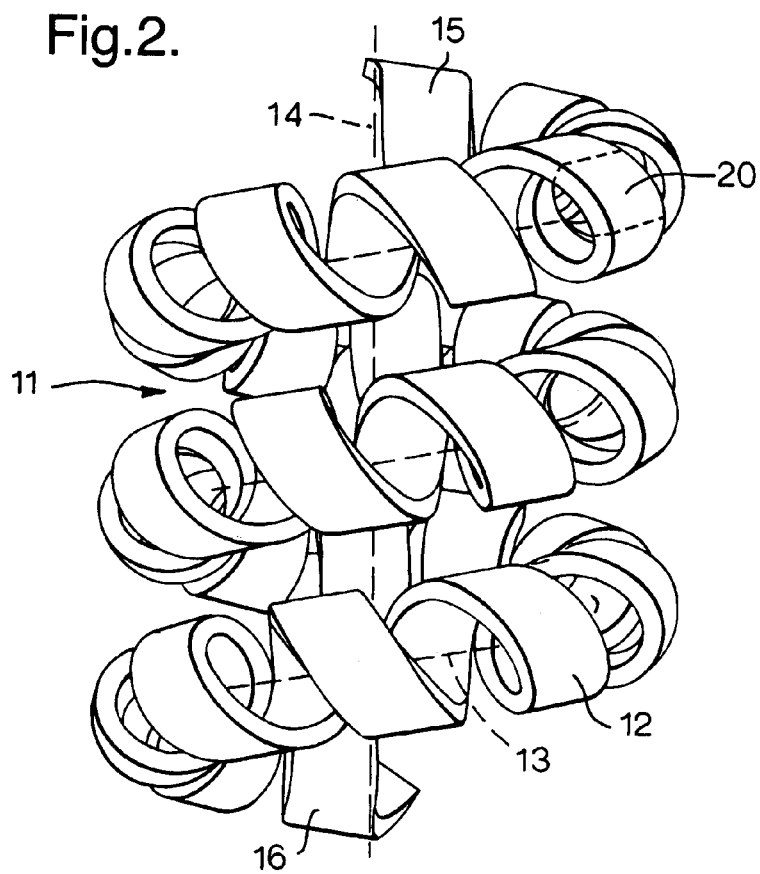
Figure 3:
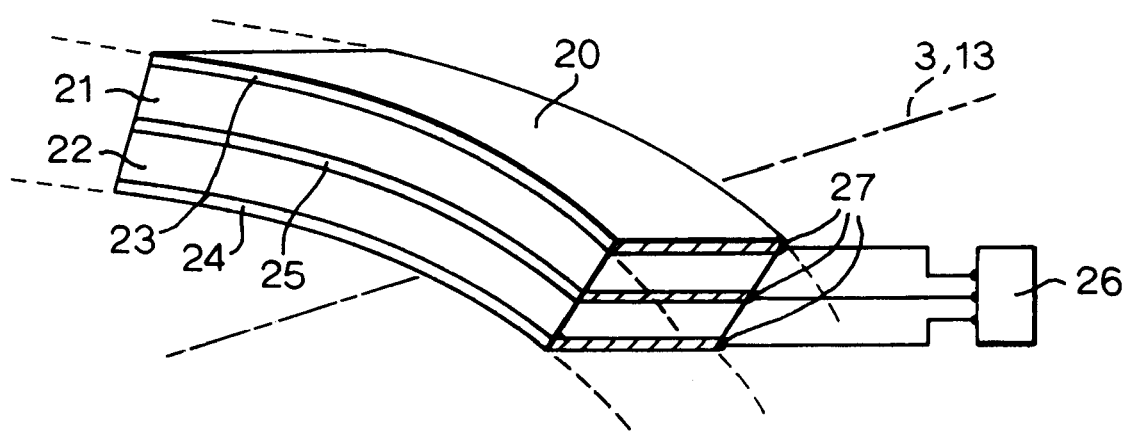
Figure 4:
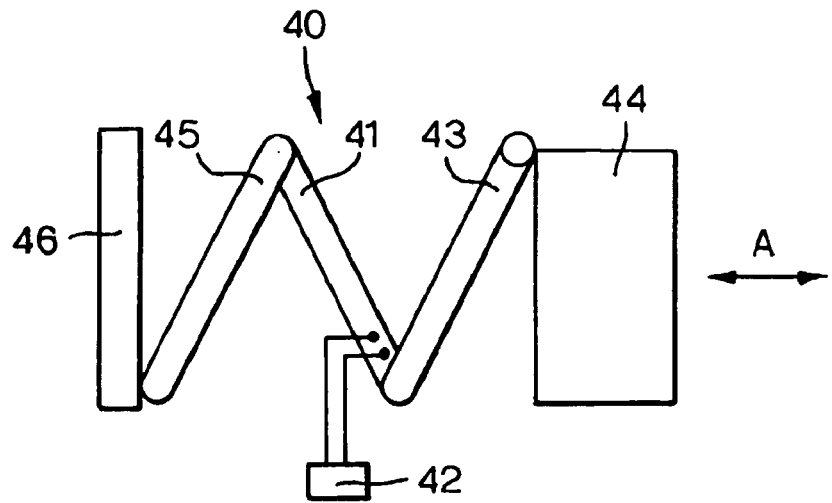
Figure 5:
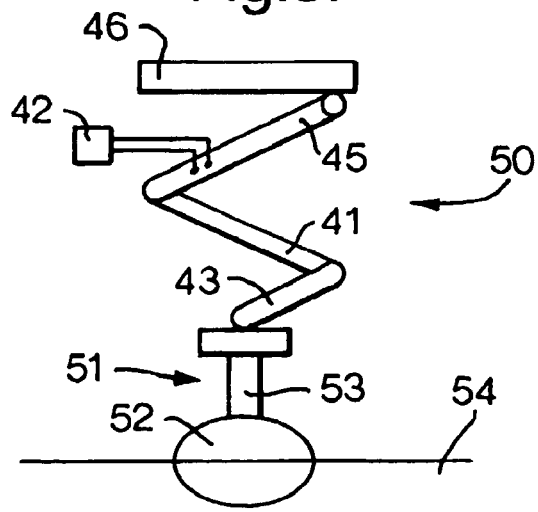
Figure 6:
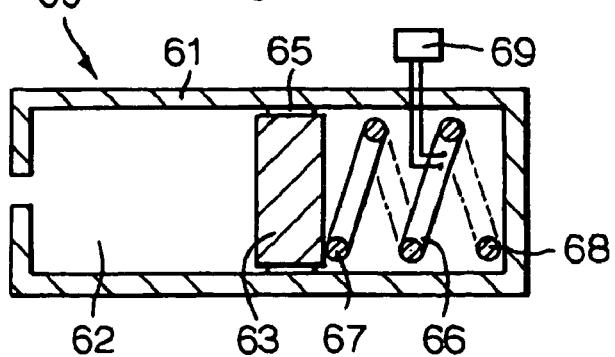
Figure 7:
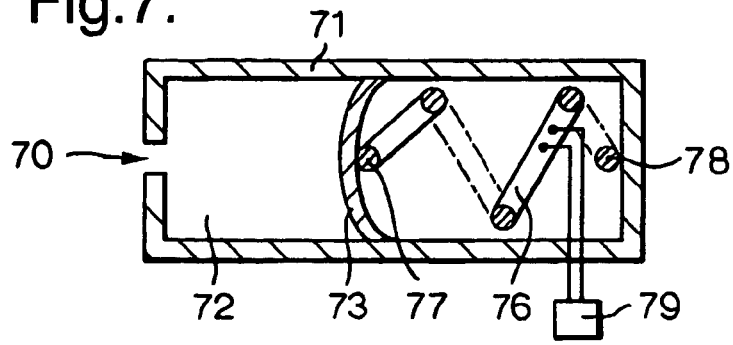
Figure 8:
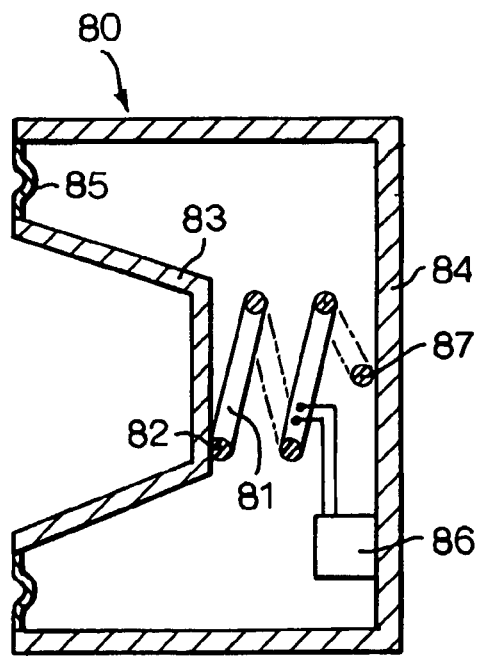
Figure 9:
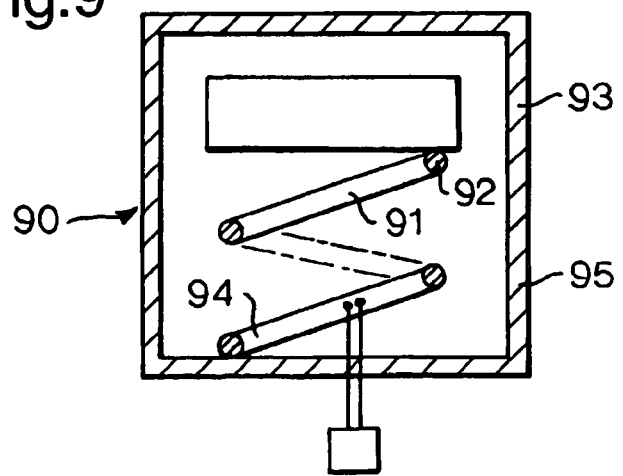
Figure 10:
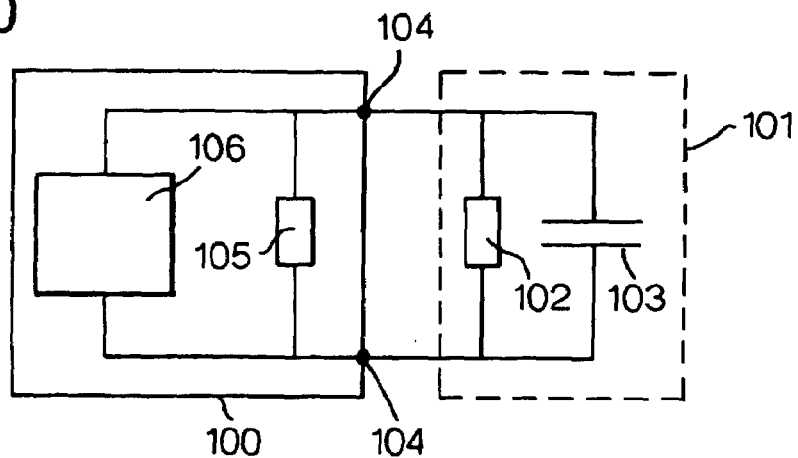
Figure 11:
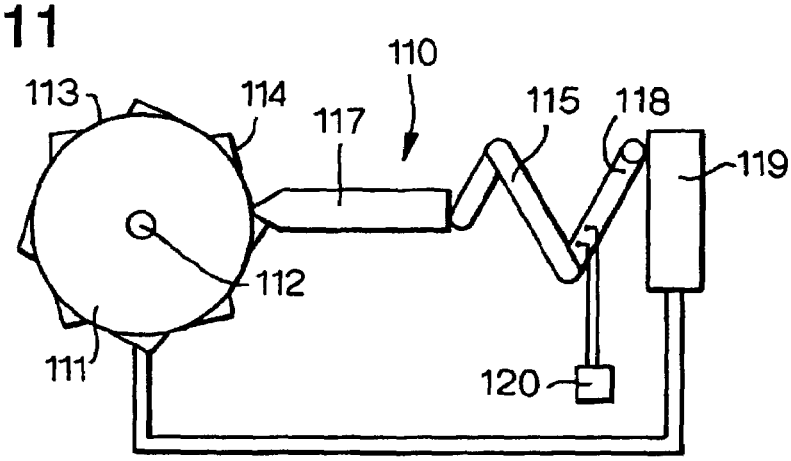
Figure 12:
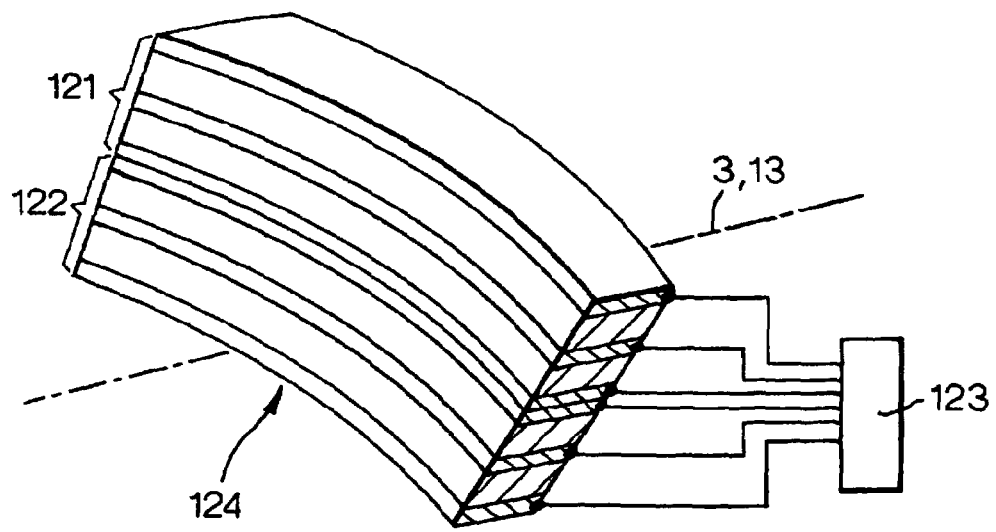

To allow better understanding, embodiments of the present invention will now be described by way of non-limitative examples with reference to the accompanying drawings in which:

FIG. 1 is a plan view of a first electro-active device;
FIG. 2 is a side view of a second electro-active device;
FIG. 3 is a perspective view of a portion of either the first device of FIG. 1 or the second device of FIG. 2;
FIG. 4 is a side view of a displacement sensor;
FIG. 5 is a side view of a fluid level sensor;
FIG. 6 is a cross-sectional view of a first pressure sensor;
FIG. 7 is a cross-sectional view of a second pressure sensor;
FIG. 8 is a cross-sectional view of a microphone;
FIG. 9 is a side view of an acceleration sensor;
FIG. 10 is a circuit diagram of a detector circuit which is an integrating current detector circuit;
FIG. 11 is a side view of a sensor in the form of a rotary encoder; and
FIG. 12 is a perspective view of a portion of either the first device of FIG. 1 or the second device of FIG. 2 having an alternative construction allowing operation of the first or second device as a gyroscope.

According to the present invention various sensors use an electro-active device. For clarity, the electro-active device will first be described, followed by the various sensors.

In the following description, the electro-active devices are described with reference to minor and major axes which are imaginary, but are nonetheless useful for visualising and defining the devices.

A first electro-active device 1 in accordance with the present invention is illustrated in FIG. 1. The device 1 comprises a structure consisting of a continuous electro-active member 2 curving in a helix around a minor axis 3 so that the structure extends along the minor axis 3. The minor axis 3 is curved, extending in a curve which is an arc of a circle around a geometrical major axis 4 perpendicular to the plane of the minor axis 3, i.e out of the plane of the paper in FIG. 1. As the minor curve 3 is planar, the thickness of the device parallel to the major axis 4 is merely the thickness of the helical structure of the electro-active member 2.

A second electro-active device 11 in accordance with the present invention is illustrated in FIG. 2. The device 2 comprises a structure consisting of a continuous electro-active member 12 to curving in a helix around a minor axis 13 so that the structure extends along the minor axis 13. The minor axis 13 is curved, extending in a curve which is a helix around a geometrical major axis 14. The electro-active device 11 is illustrated in FIG. 2 with a minor axis which extends along of a helix of three turns merely for illustration, any number of turns being possible.

FIG. 3 illustrates a portion 20 of either the continuous member 2 of the first device 1 of FIG. 1 or the continuous member 12 of the second device 11 of FIG. 2. The construction of the portion 20 being the same for both the first device 1 and the second device 2 the electro-active portion 20 is a finite portion of the continuous member 2 or 12 and hence the electro-active member 2 or 12 may be considered as a plurality of adjacent portions 20 as illustrated in FIG. 3 disposed successively along the minor axis 3 or 13. Hence, the portion 20 extends along part of a helical curve around the minor axis 3 or 13 as shown in FIG. 3.

FIG. 3 illustrates the construction of the electro-active portion 20. This construction is preferably uniform along the entire length of the minor axis 3 or 13 in order to provide uniform properties on activation. Alternatively, the device 1 or 11 may be designed with some variation along the length of the minor axis 3 or 13, either in the construction of the continuous member 2 or 20 or in the shape of the curve of the continuous member 2 or 20 around the minor axis 3 or 13.

The electro-active portion 20 has a bimorph bender construction comprising two layers 21, 22 of electro-active material extending along the length of the portion 20. The layers 21, 22 of electro-active material both face the minor axis 3 or 13. The electro-active layers 21 or 22 preferably extend, across the width of the portion 20, parallel to the minor axis 3 or 13, although there may be some distortion of the electro-active portion 20 of the continuous member 2 or 12 due to the nature of the curve around the minor axis 3 or 13. Alternatively, the layers 21 or 22 may extend, across the width of the portion 20, at an angle to the minor axis 3 or 13 so that one edge along the electro-active portion 20 is closer to the minor axis 3 or 13 than the opposite edge.

The material of the electro-active layers 21 or 22 is preferably piezoelectric material. The piezoelectric material may be any suitable material, for example a piezoelectric ceramic such as lead zirconate titanate (PZT) or a piezoelectric polymer such as polyvinylidenefluoride (PVDF). However, the material of the electro-active layers 21, 22 may be any other type of electro-active material, for example piezoresistive material, in which the electrical resistance changes as the material is deformed or strained, or electrostrictive material, which constricts on application of an electric field.

The electro-active portion 20 further comprises electrodes 23 to 25 extending parallel to the layers 21, 22 of piezoelectric material. Outer electrodes 23, 24 are provided outside the electro-active layers 21, 22 on opposite sides of the electric-active portion 20. A centre electrode 25 is provided between the electro-active layers 21 and 22. The electrodes 23 to 25 are used to apply poling voltages and to operate electro-active portion 20 in a bending mode.

On mechanical activation by bending of the portion 20 voltages are developed on the electrodes 23 to 25 and conversely on electrical activation, activation voltages are applied to the electrodes 23 to 25. On bending, the electro-active layers 21 and 22 undergo a differential change in length concomitant with bending of the portion 20 due to the constraint of the layers being coupled together at their interface formed by the centre electrode 25. One of the electro-active layers 21 or 22 expands and the other one of the electro-active layers 21 and 22 contracts The relative direction and magnitude of the activation and poling voltages may be selected in the same manner as for known linear electro-active devices having a bender construction. For example, poling voltages of sufficient magnitude to pole the electro-active layers 21 and 22 may be applied in opposite directions across the electro-active layers 21 and 22 by grounding the centre electrode 25 and applying poling voltages of the same polarity to both the outer electrodes 23, 24. In this case, on mechanical activation of the electro-active portion 20 the activation voltages are developed in the same direction across the electro-active layers 21 and 22 producing voltages of opposite polarity on the two outer electrodes 23 and 24 with respect of the centre electrode 25.

On activation the electro-active portion 20 bends around the minor axis 3 or 13, either towards or away from the minor axis 3, 13 depending on the polarity of the activation voltages. On mechanical activation, the activation voltages developed at the electrodes 23 to 25 are fed to a circuit 26. On electrical activation the activation voltages are applied from a circuit 26 through external terminals 27 electrically connected to the electrodes 23 to 25 in the manner known for known straight piezoelectric devices having a bender construction.

Electrical connection to the electrodes 23 to 25 may be made in the same way as is known for known straight devices having a bender construction, in principle at any point along the length of the device of which the portion 20 forms part but preferably at the end. The preferred technique is to provide the electrodes with fingers (not shown) extending at the end of the device at different lateral positions across the width of the device as known for straight devices having a bender construction.

It will be appreciated that other bender constructions could equally be applied to the portion 20, for example a unimorph bender construction comprising a layer of electro-active material and an inactive layer or a multimorph bender construction comprising a plurality of layers of electro-active material.

Whilst the bender construction illustrated in FIG. 3 is preferred for simplicity and ease of manufacture, it will be appreciated that the continuous numbers 2 or 12 could in fact have any construction which bends around the minor axis 3 or 13 on activation. For example, the continuous members could be electro-active elements of the type described in the application being filed simultaneously with this application entitled "Electro-Active Elements and Devices" in which the elements have two pairs of electrodes extending along the length of the member for bending across the width on activation.

On activation, the electro-active portions 20 of the continuous member 2 or 12 bend around the minor axis 3 or 13. As a result of the continuous electro-active member 2 or 12 curving around the minor axis 3 or 13, in particular in a helix, such bending is concomitant with twisting of the continuous member 2 or 12 around the minor axis 3 or 13. This may be visualised as the turns of the continuous member 2 or 12 as the bending tightening or loosening causing a twist of the structure of the member 2 or 12 along the minor axis 3 or 13. The twist of the continuous member 2 or 12 occurs along the entire length of the minor axis 3 or 13 causing a relative rotation of the ends of the structure labelled 5 and 6 in the first device 1 of FIGS. 1 and 15 and 16 in the second device 11 of FIG. 2.

It will be appreciated that the continuous member 2 or 12 could curve around the minor axis 3 or 13 in curves other than a helix to produce such twisting, for example by having the shape as though formed by twisting a flat member round the minor axis. It will also be appreciated that other structures other than a continuous member could be applied to produce twisting around the minor axis. For example the electro-active structure could consist of a plurality of electro-active portion disposed successively along the minor axis and coupled together so that the bending of each individual portion twists the adjacent portion around the minor axis causing twisting of the structure as a whole. Alternatively the electro-active structure could be a device of the type described in the application being filed simultaneously with this application entitled "Piezoelectric Devices" which comprises a plurality of electro-active torsional actuators which may comprise electro-active elements activated in shear mode.

Considering the first device 1 of FIG. 1, the twisting of the continuous member 2 around the minor axis 3 is concomitant with relative displacement of the ends of the device 5 and 6 perpendicular to the curve of the minor axis 3, that is parallel to the major axis 4. The relative displacement of the ends 5 and 6 derives from the twisting of the continuous member 2 around the minor axis 3 in combination with the curve of the minor axis 3. It is an inevitable result that twisting of a curved object causes relative displacement of the ends of that object perpendicular to the local curve of the object.

In a similar manner, on activation of the second device 11 of FIG. 2, the twisting of the continuous member 12 around the minor axis 13 is concomitant with displacement of the ends 15 and 16 of the device parallel to the major axis 14. Again, this relative displacement derives from the rotation of the continuous member 12 around the minor axis 13 in combination with the curve of the minor axis 13. In this case, the relative displacement caused by any given small section of the structure along the minor axis 13 causes relative displacement of the ends of that section perpendicular to the local curve of the minor axis 13. The overall displacement of the ends 15, 16 of the device 11 is the sum of the displacements of all the sections which results in an overall relative displacement parallel to the major axis 14.

Therefor for both the first and second devices 1 and 11 relative displacement of the ends of the structure ends 5 and 6 of the device is concomitant with twisting of the structure along its length which is concomitant with mechanical activation of each portion 20 causing an electrical signal to be generated on the electrodes 23 to 25.

The exact construction and dimensions of the member 2 or 12 and the form of the electro-active structure may be freely varied to produce the desired response. A suitable member 2 or 12 has a 0.5 mm thickness tape wound as a 4 mm diameter minor helix around the minor axis 3 or 13. When this forms the first device 1 in which the minor curve extends around about three quarters of a circle of 30 mm diameter the observed displacement is about ±6 mm. Similarly if this structure was used to form the second device 11 in which the minor curve extends along a 20 turn helix of diameter 30 mm, this would produce displacement of around ±120 mm.

In general, the minor axis, along which the structure of devices in accordance with the present invention extend, may follow any curve and the resultant displacement of the ends of the structure will be the sum of the displacement caused by each section of the structure along the curve. However, curves which are regular such as the curve of the minor axis of the first and second devices 1 and 11 are preferred so that all sections of the device caused relative displacement in a common direction and also because design and manufacture are thereby simplified.

The first and second devices 1 and 11 may be electrically activated to create mechanical displacement between the ends 5 and 6 or 15 and 16, or may be mechanically activated in which case relative displacement of the ends 5 and 6 or 15 and 16 causes an electrical voltage to be developed across the electrodes 23 to 25. In the case of electrical activation, the ends 5 and 6 or 15 and 16 of the electro-active device 1 or 11 are coupled to further elements to be relatively displaced similarly in the case of mechanical activation the ends 5 and 6 or 15 and 16 are coupled to elements which drive deformation of the device 1 or 11.

Manufacture of the electro-active devices 1 and 11 will now be described.

The preferred method of manufacture is to initially form the electro-active structure extending along a straight minor axis and subsequently to bend the straight electro-active structure so that the minor axis along which it extends becomes curved.

To form the continuous member 2 or 12 as an electro-active structure along a straight minor axis there are two preferred techniques.

The first preferred technique is to initially form the continuous member 2 or 12 as a straight member and subsequently to deform it to curve around the straight minor axis. The bender construction of the continuous member 2 or 12 is in itself known and the continuous member 2 or 12 may be formed by applying any of the known techniques for manufacturing a device having a bender construction. For example, the continuous member 12 may be initially manufactured by co-extrusion of the layers 21 and 22 of plasticised material or by co-calendering of the layers 21 and 22. Alternatively, the continuous member 2 or 12 may be made through lamination of thin layers 21 and 22. These thinner layers may be made by any suitable route, such as high shear mixing of a ceramic powder, polymer and solvent mixer followed by co-extrusion and calendering. Alternatively, techniques such as tape casting or the process called the Solutech process known in the field of ceramics nay be used.

The electrodes may be formed as an integral part of the manufacture of the continuous member 2 or 12, for example by being in co-extruded or co-calendered. Further electrodes, which may be activation layers 23 to 25 or may be terminal electrodes to allow access to the electrodes 23 to 25, may be applied by printing, by electro-less plating, through fired-on silver past or by any other appropriate technique.

The second preferred technique is to initially manufacture the continuous member as a cylinder or other tube with a multi-layered bender construction of electro-active layers 21 and 22 and electrodes 23 to 25 and subsequently to cut the member along the helical line to leave the continuous member 2 or 12 extending in a helix around the axis of the cylinder or tube which then constitutes the minor axis.

Subsequently the straight structure is bent to curve the minor axis along which the structure extends.

To deform the member and structure, there must exist in the initially formed member a sufficient degree of flexibility. Suitably deformable electro-active materials are known, typically including constituent polymers which enhance the deformability. With such materials after shaping, the constituent polymers are burnt out, typically at up to 600° C. and the material is then densified through further sintering at higher temperature, typically 1000° C. to 1200° C. In this case, the electro-active structure is initially formed with enlarged dimensions to allow for linear shrinkage which occurs during sintering, typically of around 12 to 25%.

The curving of the straight member and the bending of the structure may be performed around formers. The formers are subsequently removed either physically or by destruction of the former for example by melting, burning or dissolving.

A number of sensors will be described using the electro-active devices of the type described above. The electro-active structures of the electro-active devices are arranged to generate an electrical signal on mechanical activation by relative displacement of the ends of the structure. The sensors further comprise a detector circuit connected to the electro-active device to detect the generated electrical signal, and hence the relative displacement. The electro-active devices are arranged to be relatively displaced by a system to be sensed and hence provide for the conversion of a motion into an electrical signal allowing the motion, or another property, to be measured.

In the figures illustrating the sensors, the electro-active device is shown as having a structure extending along a minor axis which curves in a helix, as in the second device 11 of FIG. 2, but this is merely for illustration and the electro-active device may have any of the types of structure described above.

The simplest form of sensor using the electro-active device described above is a displacement sensor for measuring the displacement of a movable object. In this case, the moving object is arranged to displace one end of the structure of the electro-active device with respect to the other end which is held fixed. For such a displacement sensor, the electro-active device is designed to have a mechanical stiffness sufficiently low that it does not significantly influence the displacement of the system being measured. In such an application, the advantage of using the electro-active device of the type described above is that the electro-active device provides a large displacement capability and has a relatively low compliance.

FIG. 4 illustrates such a displacement sensor 40 comprising an electro-active device 41 electrically connected to a detector circuit 42. One end 43 of the electro-active device 41 is coupled to an object 44 whose displacement is to be sensed. The other end 45 of the electro-active device 41 is coupled to a support 46 relative to which the object 44 is moveable. As the object 44 moves in the direction A the ends 43 and 45 of the electro-active device 41 are relatively displaced, thereby mechanically activating the electro-active device 41 which generates an electrical signal. The detector circuit 42 detects the generated electrical signal. The electrical signal is a voltage, so the detector circuit 42 is a voltage detector and is arranged to have a high input impedance.

FIG. 5 illustrates a fluid level sensor 50 which is another form of displacement sensor. Except as described below, the fluid level sensor 50 is identical to the displacement sensor 40, so a description thereof will not be repeated. The free end 43 of the electro-active device 41 is coupled to an element 51 comprising a float 52 and a weight 53. In use, the float 52 floats in a fluid 54 whose level is to be measured. As the level of the fluid 54 changes, the float 52 is displaced, which displacement is measured by the sensor 50. The weight 53 is provided to ballast the float downwards to float at the correct level in the fluid 54.

It will be appreciated that various modifications to the fluid level sensor 50 are possible. For example, the float 54 may be arranged on a guide to guide movement of the float 54. Also, a mechanical limit may be provided to limit the movement of the float 54 from passing the maximum relative displacement of the end of the structure of the electro-active device 41.

The electro-active device may also be used as a force sensor. In this case, the electro-active device is again coupled between two relatively moveable elements, one of which is to receive the applied force and the other of which is a support which is held fixed. The force sensor is arranged to mechanically resist the applied force so that the ends of the electro-active device are relatively displaced by an amount corresponding to the magnitude of the applied force. Depending on the magnitude of the force to be measured, this can be achieved by selecting an electro-active device with an appropriate stiffness. Alternatively, a further mechanical arrangement may be provided in parallel with the electro-active device, for example a resilient biassing means such as a spring. The advantage of using the electro-active device of the present invention as such a force sensor is that the relatively low compliance of the electro-active device significantly improves the sensitivity of the force sensor. Also, a high resolution, large range, linear sensor is produced due to the linear characteristic of the electro-active device. A force sensor may for example be used to measure weight, and thus mass.

FIG. 6 illustrates a pressure sensor 60 which is a form of such a force sensor. The pressure sensor 60 comprises a support 61 defining a pressure chamber 62. A piston 63 is provided with one end 64 in the pressure chamber 62. The piston 63 is mounted by a bearing 65 to the support 61 to be reciprocally movable along the pressure chamber 62. The pressure sensor 60 further comprises an electro-active device 66, a first end 67 of which is coupled to the piston 63 and the second end 68 of which is coupled to the support 61. The electro-active device 66 is electrically coupled to a detector circuit 69 which detects the electrical signal generated by the electro-active device 66 and hence provides a measurement of the displacement and force applied to the electro-active device 66. In use, a fluid whose pressure is to be measured is introduced into the pressure chamber 62. This applies a force to the piston 63 dependent on the pressure of the fluid, which relatively displaces the ends 67 and 68 of the electro-active device 66, causing an electrical signal to be generated which is detected by a detector circuit 69.

FIG. 7 illustrates a pressure sensor 70 which is another form of force sensor. The pressure sensor 70 comprises a support 71 defining a pressure chamber 72. A piston 73 is in the form of a flexible diaphragm coupled around its circumference to the support 71 forms one end of the pressure chamber 72. The pressure sensor 70 further comprises an electro-active device 76, a first end 77 of which is coupled to the piston 73 and the second end 78 of which is coupled to the support 71. The electro-active device 76 is electrically coupled to a detector circuit 79 which detects the electrical signal generated by the electro-active device 76 and hence provides a measurement of the displacement and force applied to the electro-active device 76. In use, a fluid whose pressure is to be measured is introduced into the pressure chamber 72. This applies a force to the piston 73 dependent on the pressure of the fluid, which relatively displaces the ends 77 and 78 of the electro-active device 76, causing an electrical signal to be generated which is detected by a detector circuit 79.

A velocity sensor may be produced by arranging a plurality of pressure sensors, for example the pressure sensors 60 or 70 illustrated in FIGS. 6 and 7, in a Pitot tube. The difference between the two measured pressures gives the fluid velocity. Such an arrangement using a Pitot tube with other types of pressure sensor is in itself conventional.

The electro-active device may also be used to detect sound so that the sensor constitutes a microphone. In this case, one end of the electro-active device is coupled to a sound detecting element adapted to be moved by sound waves incident thereon, the design of the sound detecting element being the same as for conventional microphones and dependent on the frequency and magnitude of the sound waves to be detected.

Such a microphone may have the same arrangement as for known microphones using an electromagnetic coil with the electromagnetic coil replaced by the electro-active device. As compared to using an electromagnetic coil, the microphone in accordance with the present invention achieves a number of advantages. The use of the electro-active device allows the microphone to have a large dynamic range, a large frequency range and a high sensitivity because the level of the generated electrical signal is high. In particular, the frequency response of the electro-active device enables such a microphone to have a frequency response which covers the full audio range and some sub-audio frequencies. The low level frequency response achievable also means that the microphone can be used as a non-contact displacement meter. Another advantage is that the mechanical design of the microphone can be tuned to have a good impedance match with the air impedance, this being difficult with an electromagnetic microphone. This property, and the large strains of the electro-active device, enable the microphone to produce a significantly larger electrical signal than is produced by traditional microphones. Such a larger signal amplitude improves the signal-to-noise ratio. A further advantage is that the electro-active device has a significantly reduced weight as compared to the corresponding electromagnetic coil arrangement.

As an example, FIG. 8 illustrates such a microphone 80 in which an electro-active device 81 is coupled at one end 82 to a cone 83 which forms a sound detecting element. The other end 84 of the electro-active device 81 is coupled to a support 84. The cone 83 is also supported by the support 84 by a flexible seal 85 disposed around the circumference of the cone 83. The arrangement of the microphone 80 is conventional except for the electro-active device 81. In use, sound waves incident on the cone 83 cause vibrational movement of the cone 83 which drives vibrational displacement of the ends 82 and 84 of the electro-active device 81. The electro-active device 81 is coupled to a detector circuit 86 which detects the electrical signal output by the electro-active device 81 which corresponds to the sound. The detector circuit 86 has conventional circuitry for detecting electrical signals corresponding to sound signals.

The electro-active device may also be used to form an acceleration sensor by coupling one of the ends of the electro-active device to a mass. The inertia of the mass will limit its movement when the other end of the electro-active device is displaced, so that the generated output signal is representative of the acceleration of the other end of the electro-active device. Thus the electro-active device may be used to detect acceleration of the other end of the electro-active device or an element coupled thereto.

An acceleration sensor in accordance with the present invention provides a number of advantages as compared to known acceleration sensors formed from a simple piezoelectric crystal. Most significantly, an acceleration sensor in accordance with the present invention allows for much more sensitive detection. Also, the electro-active device generates significantly larger signal amplitudes which reduces the signal-to-noise ratio and hence reduces the signal conditioning needed to maintain a low noise electrical signal. Furthermore, the use of the electro-active device allows the acceleration sensor to operate at low frequencies, close to DC.

The generated electrical signal provides a measurement of acceleration. As with known acceleration sensors, the detector circuit may be arranged to integrate this signal to obtain a measurement of velocity and displacement, so that the sensor constitutes a velocity or displacement sensor. Thus the acceleration sensor may be used to produce a position sensor for a number of applications. By arranging a plurality of such sensors to detect acceleration in orthogonal directions, a 2-D or 3-D position sensor may be produced, thereby providing the potential use as a 2-D or 3-D "mouse" as an input device for a computer system. This would have the considerable advantage over conventional "mice" of requiring no exposed parts such as a ball and no wearing surfaces. Similarly, the 3-D "mouse" could be used as an input device for a virtual reality system.

FIG. 9 illustrates such an acceleration sensor 90 comprising an electro-active device 91 coupled at one end 92 to a mass 93 and at the other end 94 to a support 95. The mass 93 and the support 95 are relatively moveable, so the inertia of the mass 93 limits its movement when the support 95 is displaced. Accordingly, the generated output signal is representative of the acceleration of the support 95. The electro-active device 91 is electrically connected to a detector circuit 96 for detecting the generated electrical signal.

The detector circuit in all the sensors in accordance with the present invention may be a high impedance voltage detector. As an alternative the detector circuit may be an integrating current detector circuit. This extends the performance of the sensors from AC to DC, as follows. The electro-active devices of the type described above are inherently AC-coupled due to their electrical nature which is a very large resistance in parallel with a moderate capacitance (typically hundreds of nano-farads). The resistance derives from the resistance of the electro-active material and the capacitance derives from the electrodes disposed across the electro-active material. Using an integrating current detector circuit which measures the movement of charge of the electro-active device over a long period of time, it is possible to extend the performance of the sensor to DC.

As an example, FIG. 10 illustrates an integrating current detector circuit 100. FIG. 10 illustrates the effective circuit of an electro-active device 101 as a resistance 102 in parallel with a capacitance 103. The electro-active device 101 is electrically connected across the terminals 104 of the detector circuit 100. The detector circuit 100 comprises a low resistance sensing element 105 which may be a low impedance resistor or a special sensor such as a SQUID (Super-conducting QUantum Interference Device) that measures current by the magnetic field induced by moving charges. As the electro-active device 101 is displaced the charge thus generated passes through the low resistance sensing element 105. The detector circuit 100 further includes a circuit 106 arranged to integrate or count, the passage of charge through the low resistance sensing element 105. The circuit 106 includes instrumentation electronics which may be either analogue or digital, provided that it has sufficient sensitivity to measure small current.

The electro-active device may also be used to detect rotation of a rotary element, so that the sensor constitutes a rotary encoder. As an example, FIG. 11 illustrates such a rotary encoder 110 comprising a rotary element 111 rotatable about a shaft 112 and thereby defining an axis of rotation. The circumference 113 of the rotary element 111 is formed with a plurality of teeth 114. Thus the teeth 114, provide the circumference with a varying radius. Any features of varying radius other than the teeth 114 may be used.

The rotary encoder 110 further comprises an electro-active device 115 of the type described above electrically connected to a detector circuit 120. The electro-active device 115 is coupled at one end 116 to a member 117 which engages the circumference of the rotary element 111. The other end 118 of the electro-active device 115 is coupled to a support 119 which is fixed relative to the axis of rotation of the rotary element 111 about the shaft 112. As a result of the member 117 engaging the circumference of the rotary element 111, as the rotary element 111 rotates the passage of the teeth 114 past the member 117 displaces the member 117. This in turn relatively displaces the ends 116 and 118 of the electro-active device 115 generating an electrical signal which is detected by the detector circuit 120. Consequently, the detector circuit 120 detects the rotation of the rotary element, in a similar manner to conventional rotary encoders.

The teeth 114 are provided with a different profile in opposite directions around the axis of rotation, in particular by having different slopes on either side of each tooth 114. As a result the form of the electrical signal generated by the electro-active device 115 differs depending on the direction of rotation of the rotary element 111. This allows the detector circuit 120 to detect the direction of rotation from the form of the output signal.

It will be appreciated that other variations in the shape of the features on the rotary element 111 may be made in the same manner as is conventional for known rotary encoders, for example by varying the spacing or width of the features to determine the absolute rotary position of the rotary element 111.

The electro-active device of the type described above such as that illustrated in FIGS. 1 to 3 may also be employed as a gyroscope by modifying the construction of the electro-active structure so that it provides for (a) electrical activation of the electro-active device by application of an activating electrical signal to drive mechanical displacement of the device and, independently therefrom, (b) generation of an electrical signal by a mechanical activation. In use, the sensor is electrically activated by an alternating electrical signal and the resulting displacement of the electro-active device is detected. If the electro-active device is stationary, the activating and generated electrical signals will correspond. However, when the external accelerations of the electro-active device change, the mechanical displacement of the electro-active device will vary depending on the relative orientation of the external acceleration and the electro-active device. The mechanical displacement of the electro-active device will vary in accordance with the change in orientation of the device, causing a corresponding change in the output electrical signal. The difference between the activating electrical signal and the generated signal provides a measure of the change in orientation of the sensor in a similar manner to conventional gyroscopes. Thus the sensor constitutes a gyroscope because it detects changes in the orientation of the system and is suitable for use in stability and control systems. By providing plural electro-active devices orientated in orthogonal directions a multi-dimensional gyroscope may be constructed.

FIG. 12 illustrates the construction of a portion 124 of an electro-active device for providing the independent (a) electrical activation and (b) detection of mechanical displacement. The construction is preferably uniform along the entire length of the minor axis 3 or 13 and is an alternative to the construction of the electro-active portion 20 illustrated in FIG. 3. The portion 124 is a portion of either the continuous member 2 of the first device 1 of FIG. 1 or the continuous member 12 of the second device 11 of FIG. 2, so the portion 124 extends along part of a helical curve around the minor axis 3 or 13 as shown in FIG. 12.

In a first part 121 of the electro-active portion 124, the electro-active portion 124 has a bimorph bender construction which is identical to the bimorph bender construction of the electro-active portion 20 of FIG. 3, so a description thereof will not be repeated. However, there is a difference in how this first part 121 of the portion 124 is activated in use. In particular, instead of being mechanically activated, this part 121 is electrically activated by application of an activating electrical signal of a predetermined frequency from a circuit 123. The activating electrical signal causes the portion 124 to bend around the minor axis 3 or 13 and concomitantly the structure of the electro-active device twists around the minor axis 3 or 13 causing a relative displacement of the ends of the structure occurs.

In addition, a second part 122 of the electro-active portion 124 is able to independently detect the mechanical displacement generated when the first part 121 is electrically activated. The second part 122, like the first part 121, has an identical construction to the electro-active portion 20 illustrated in FIG. 3. The layers of the first and second parts 121 and 122 extend parallel to one another. The second part 122 is mechanically activated by the mechanical displacement of the first part 121, thereby causing generation of an electrical signal corresponding to the actual mechanical displacement. The electrodes of the second part 121 are electrically connected to the circuit 123 which acts as a detector circuit to detect the generated electrical signal. The circuit 123 also compares the generated electrical signal with the activating electrical signal applied to the electrodes of the first part 121 to derive a measure of the change of orientation of the electro-active device in the same manner as for known gyroscopes. Thus when the construction of the portion 124 is used, the electro-active device constitutes a gyroscope.

The invention claimed is:

1. A sensor comprising an electro-active device electrically connected to a detector circuit, the electro-active device comprising an electro-active structure which extends along a curved minor axis and arranged, on activation by relative displacement of the ends of the structure, for the structure concomitantly to twist around the minor axis, the electro-active structure comprising electro-active portions disposed successively along the minor axis and arranged to be mechanically activated by being bent around the minor axis concomitantly with said twisting of the electro-active structure around the minor axis to generate an electrical signal, the detector circuit being arranged to detect the generated electrical signal.

2. A sensor as claimed in claim 1, wherein the detector circuit is arranged to detect the electrical signal as a voltage.

3. A sensor as claimed in claim 1, wherein the detector circuit is an integrating current detector circuit.

4. A sensor as claimed in claim 1, wherein the structure of the electro-active device is electrically activatable by application of an activating electrical signal independently of the generation of said first mentioned-electrical signal, the sensor further comprising an alternating signal source electrically connected to the electro-active device to supply said activating electrical signal so that the sensor constitutes a gyroscope.

5. A sensor as claimed in claim 1, wherein the electro-active structure includes electrodes for development of the electrical signal thereacross on mechanical activation of the electro-active structure.

6. A sensor as claimed in claim 1, wherein the minor axis extends in curve which is a helix.

7. A sensor as claimed in claim 1, wherein the minor axis extends in curve which is planar.

8. A sensor as claimed in claim 1, further comprising a rotary element with a circumference around the axis of rotation having features of varying radius, one end of the electro-active device being coupled to a member engaging the circumference to detect the features so that the sensor constitutes a rotary encoder.

9. A sensor as claimed in claim 8, wherein the features have a different profile in opposite directions around the axis of rotation.

10. A sensor as claimed in claim 1, wherein the electro-active structure comprises a continuous electro-active member curving around the minor axis, said electro-active portions being adjacent finite portions of the continuous member.

11. A sensor as claimed in claim 10, wherein the continuous electro-active member curves in a helix around the minor axis.

12. A sensor as claimed in claim 1, wherein the successive electro-active portions have a bender construction of a plurality of layers including at least one layer of electro-active material.

13. A sensor as claimed in claim 12, wherein the electro-active portions have a bimorph bender construction of two layers of electro-active material or a multimorph bender construction of more than two layers of electro-active material.

14. A sensor as claimed in claim 1, wherein the electro-active structure includes piezoelectric material.

15. A sensor as claimed in claim 14, wherein the piezoelectric material is a piezoelectric ceramic or a piezoelectric polymer.

16. A sensor as claimed in claim 15, wherein the piezoelectric material is lead zirconate titanate (PZT) or polyvinylidenefluoride (PVDF).

17. A sensor as claimed in claim 1, wherein the ends of the structure of the electro-active device are coupled to relatively movable elements whose relative displacement is to be detected.

18. A sensor as claimed in claim 17, wherein one of the elements is a float.

19. A sensor as claimed in claim 17, wherein one of the elements is a sound detecting element adapted to be moved by sound waves incident thereon so that the sensor constitutes a microphone.

20. A sensor as claimed in claim 17, wherein the other element supports said one of the elements.

21. A sensor as claimed in claim 17, wherein one of the elements is a mass so that the sensor constitutes an acceleration sensor for detecting acceleration of the other element.

22. A sensor as claimed in claim 17, wherein one of the elements is a piston adapted to be moved by application of a fluid pressure thereto so that the sensor is a pressure sensor.

23. A sensor as claimed in claim 22, wherein the piston is a rigid member.

24. A sensor as claimed in claim 22, wherein the piston is a flexible diaphragm.

* * * * *